United States Patent [19]

Gundotra et al.

[11] Patent Number: 5,369,880
[45] Date of Patent: Dec. 6, 1994

[54] METHOD FOR FORMING SOLDER DEPOSIT ON A SUBSTRATE

[75] Inventors: Ved V. Gundotra, Coral Springs; Lonnie L. Bernardoni, Boca Raton; Edward J. Hall, Hollywood, all of Fla.

[73] Assignee: Motorola, Inc., Schaumburg, Ill.

[21] Appl. No.: 57,374

[22] Filed: May 6, 1993

[51] Int. Cl.⁵ .............................. H05K 3/34
[52] U.S. Cl. ....................... 29/840; 174/263; 228/180.1; 437/209
[58] Field of Search .......... 29/840; 174/263; 427/97; 228/180.1, 180.2; 437/209

[56] References Cited

U.S. PATENT DOCUMENTS

| | | | |
|---|---|---|---|
| 3,392,442 | 7/1968 | Napier et al. | 29/840 |
| 3,436,818 | 4/1969 | Merrin et al. | 29/840 |
| 4,237,607 | 12/1980 | Ohno | 29/840 |
| 4,793,543 | 12/1988 | Gainey et al. | 29/840 X |
| 4,818,728 | 4/1989 | Rai et al. | 437/209 |
| 4,940,181 | 7/1990 | Juskey et al. | |
| 5,133,495 | 7/1992 | Angulas et al. | 228/180.1 |
| 5,203,075 | 4/1993 | Angulas et al. | 29/840 X |
| 5,260,518 | 11/1993 | Tanaka | 174/263 X |

FOREIGN PATENT DOCUMENTS 4-162587  6/1992  Japan ................ 29/840

*Primary Examiner*—Carl J. Arbes
*Attorney, Agent, or Firm*—Andrew S. Fuller; Daniel K. Nichols

[57] ABSTRACT

An electronic circuit assembly (100) includes a circuit carrying substrate (150) on which electrical components (130) are mounted using solder deposits (125) having an essentially planar surface. A solder deposit (125) is created by forming a recess (155) in the substrate (150), providing a metallic pad (110) about the recess (155), depositing solder paste (120) on the metallic pad (110), and reflowing the solder paste (120) on the metallic pad (110). The electronic circuit (100) is assembled by placing electrical components (130) on the substrate (150) having solder deposits (125), and by further reflowing the solder deposits (125) on the metallic pad (110).

5 Claims, 2 Drawing Sheets

METHOD FOR FORMING SOLDER DEPOSIT ON A SUBSTRATE

TECHNICAL FIELD

This invention relates in general to electronic circuit assemblies, and in particular, to the solder pad design used in the manufacturing of electronic circuit assemblies.

BACKGROUND

This invention relates to the assembly of electronic circuitry which includes the mounting of discrete electrical components on a circuit substrate, such as a printed circuit board (PCB). These electrical components are decreasing in size in response to the demand for smaller electronic packages, and this in turn requires a corresponding response in the advancement of manufacturing technology.

In the current manufacturing technology, solder is often used to secure an electrical component to the PCB, and also to provide electrical connection between the electrical component and the underlying electrical circuitry on the PCB. Typically, a solder screening process is used to apply the solder to the PCB in preparation for the placement of electrical components. In this process, the layout for the PCB will include solder pads on which electrical components are to be mounted. A stencil on which openings have been created to coincide with the targeted solder pads is placed over the printed circuit board. Solder is deposited on the solder pads by forcing the solder through the stencil and onto the targeted solder pads. The amount of solder deposited will depend of the dimensions of each opening. At this stage, the solder is in the form of a solder paste, which comprises very small solder balls held together with a flux. The solder paste is first heated until the solder is in a molten state, then the solder is solidified by cooling. The term "reflow" is commonly used in the art to describe the transformation of the solder from solid to molten state and back to solid. In some manufacturing processes the electrical components are placed on the solder paste before solder reflow occurs. Thus, the electrical components are secured to the PCB after the solder reflow is completed. However, the solder screening process is sometimes ill-suited for in-line manufacturing. Thus, it is often desirable to completed the solder screening processing off-line by performing solder reflow on the PCB before the electrical components are placed. A second solder reflow is performed after the electrical components are placed.

Several technical problems are encountered with the use of the solder screening process which are exacerbated as the electrical components become smaller. As illustrated in FIG. 2, one of the primary problems in the prior art is the shape of the solder on the solder pad 11 after the solder is reflowed. The reflowed solder 25 on the solder pad 11 sometimes assume a dome-like shape 25, rather than a more desirable planar shape, and as shown in FIG. 3, this can adversely affect the placement of the electrical components 30. The dome-shape in conjunction with the combined tolerances of the placement mechanism and the components, may cause a misalignment of the components on the PCB 50. The ultimate shape of the reflowed solder is influenced by the amount of solder paste deposited on the solder pad. A smaller deposit of solder would lessen of the impact of the shape of the solder deposit on smaller electrical components. However, limitations on the minimum dimensions of stencil openings affect the minimum amount of solder which may be deposited. Furthermore, there is a minimum amount of solder required to ensure proper electrical connection and proper retention of the component to the PCB.

An additional problem with prior art implementations is the resultant increased height of the reflowed solder. This increase in height often varies, which may result in damage to delicate electrical components placed by automatic placement equipment because of an increased in pressure on the components during placement. Thus, a method for reducing solder height while still retaining the minimum amount of solder required was a long-felt but unfulfilled need in the art.

The advent of the increasingly smaller electrical components coupled with the need for more reliability in the manufacturing process for electronic circuitry have elevated the importance of finding solutions to the above-mentioned problems.

SUMMARY OF THE INVENTION

The invention comprises a method for forming a solder deposit having a planar surface on a substrate. This is accomplished by forming a recess in the substrate, providing a metallic pad about the recess, depositing solder paste on the metallic pad, and reflowing the solder paste on the metallic pad. A more planar surface may be achieved for reflowed solder created in this manner. In another aspect of the invention, an electronic circuit is assembled by placing electrical components on a substrate having reflowed solder deposits, and by further reflowing the solder deposits on the metallic pad.

DETAILED DESCRIPTION OF THE PREFERRED EMBODIMENT

Figure 7:
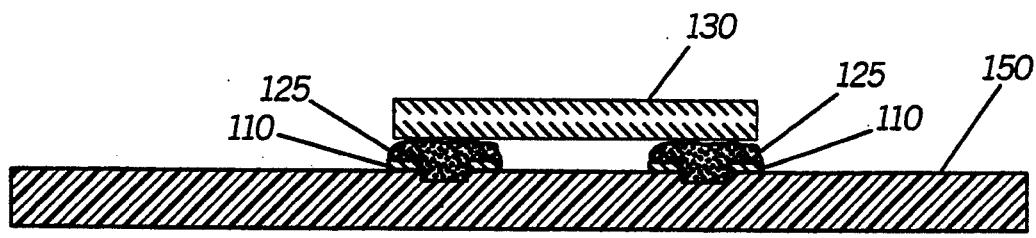
FIG. 7 is a cross-sectional view of a portion of an electronic circuit assembly in accordance with the present invention.

Referring now to FIG. 7, a portion of an electronic circuit assembly 100 is shown which highlights essential elements of the present invention. A substrate, such as a printed circuit board (PCB) 150, hosts or carries electrical circuitry (not shown) together with electrical components 130. The electrical components 130 are secured to the PCB 150 by solder 125. The solder 125 also provides electrical coupling between the electrical components 130 and the electrical circuitry on the PCB 150. The solder 125 is situated on a metallic pad 110 ("solder pad") which is electrically coupled to the electrical circuitry on the PCB 150. The solder pad 110 is formed from metal to provide good electrical conductivity between the electrical components 130 making electrical contact with the solder 125 and the electrical circuitry within the substrate. The location of these solder pads 110 are designed to coincide with the target location of the electrical components 130 comprising the electronics circuit. The electronic circuit assembly 100 can be incorporated into an electronic device such as a radio (not shown).

Figure 4:
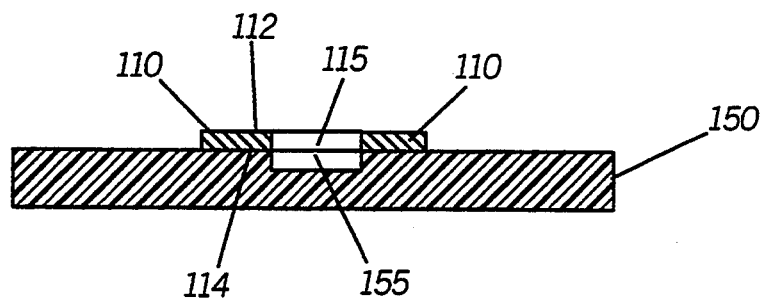
FIG. 4 is a cross-sectional view of a solder pad and supporting substrate in accordance with the present invention.
Figure 5:
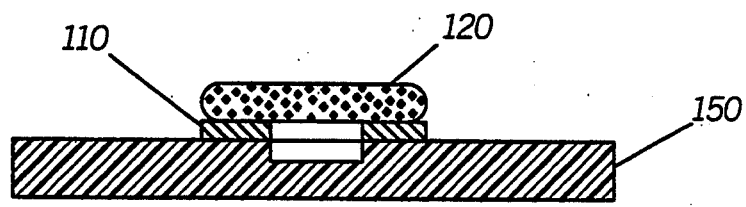
FIG. 5 is a cross-sectional view of a solder paste deposit on a solder pad and supporting substrate in accordance with the present invention.

Referring to FIG. 4, which shows a cross-sectional view of the preferred embodiment of the solder pad 110 and the underlying PCB 150, the solder pad 110 includes a cavity 115 formed within the solder pad 110 which extends through the solder pad 110 from the upper surface 112 to the lower surface 114 of the solder pad 110. The PCB 150 has a recessed portion 155 formed therein, directly below the cavity 115 formed within the solder pad 110. Both the cavity 115 of the solder pad 110 and the recessed portion 155 of the PCB 150 are designed to receive molten solder during the manufacturing process.

Figure 1:
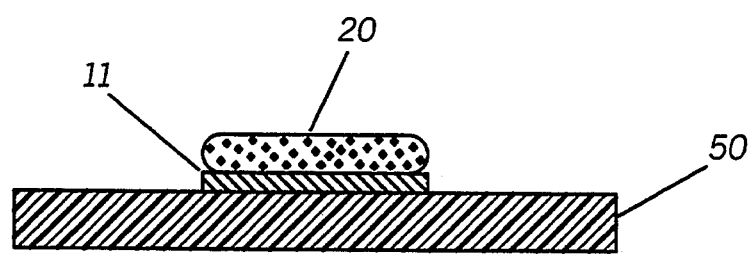
FIG. 1 is a cross-sectional view of a solder paste deposit on a solder pad and supporting substrate used in the prior art.
Figure 2:
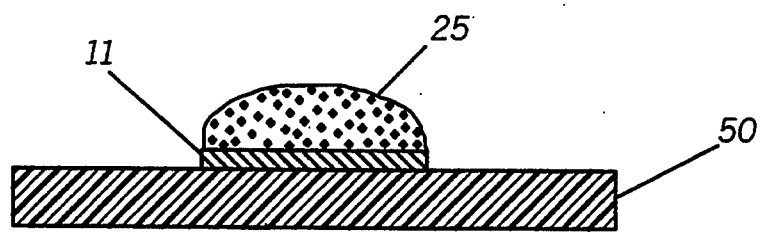
FIG. 2 is a cross-sectional view of reflowed solder on a solder pad and supporting substrate used in the prior art.
Figure 6:
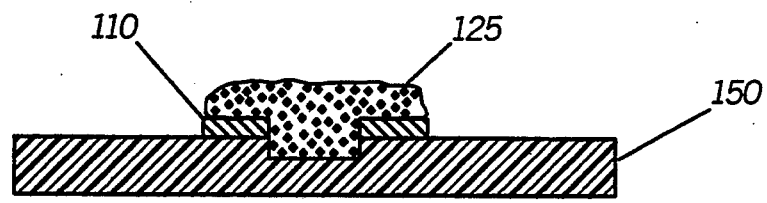
FIG. 6 is a cross-sectional view of a reflowed solder on a solder pad and supporting substrate in accordance with the present invention.

The manufacturing process for electronic circuit assemblies can be improved using current manufacturing technology while incorporating the solder pad design and substrate modifications of the preferred embodiment. A PCB 150, or other substrate, is provided which hosts electrical circuitry on which solder pads 110 electrically coupled to the electric circuitry are located. The solder pad design and corresponding modification to the PCB 150 may be achieved by drilling through the solder pad 110 and into the underlying PCB 150, thus creating a cavity 115 through the solder pad 110 and a recessed portion 155 in the underlying PCB 150. Alternatively, the recessed portion 155 may be first created in the PCB 150, after which the solder pad 110 is overlaid on the PCB 150 such that a portion of the solder pad 110 occupies the recessed portion 155 of the PCB 150. In this alternative approach, the cavity 115 within the solder pad 110 would not extend through the solder pad 110, but would be in the form of a dimple in the solder pad 110. Next, solder paste 120 is deposited on the solder pad 110 using a solder screening process which is commonly known in the art. For applications requiring a small deposit of solder paste, a deposit of solder paste of approximately 4–7 mils is achievable using current technology. The difficulty of reliably depositing less solder has been previously described with respect to the prior art. The solder is then reflowed by heating the solder paste 120 until the solder is in a molten state and then cooling the solder until it is solidified. It is after this reflow step that the benefits of the invention are clearly evident. Referring to FIG. 1, which illustrates the prior art, the solder paste 20 of approximately 4–7 mils (0.102–0.178 mm.) in height, would, after reflow, assume a dome-like shape of approximately 3–5 mils (0.076–0.127 mm.) in height as shown in FIG. 2. Referring to FIG. 6, the same dimension solder paste deposit 120 would, after reflow, assume a more planer shape of approximately 1–2 mils (0.025–0.051 mm.) in height. This is achieved by the accumulation of solder during the molten state within the cavity 115 of the solder pad 110 and the recessed portion 155 of the underlying PCB 150, which has a leveling effect on the reflowed solder 125, thereby permitting the upper surface of the reflowed solder 125 to assume a more planar shape. Next, flux (not shown) is deposited on the reflowed solder where the contacts for electrical components 130 are to be made. The flux serves to temporarily hold the electrical components 130 in place until solder reflow can effect a more permanent bonding between the electrical components 130 and the reflowed solder. The electrical components 130 are then placed on the flux using automated placement equipment, or alternatively, some components may be hand placed. The solder is then reflowed to secure permanent attachment of the electrical components 130 to the solder pad 110 and to the underlying PCB 150.

Figure 3:
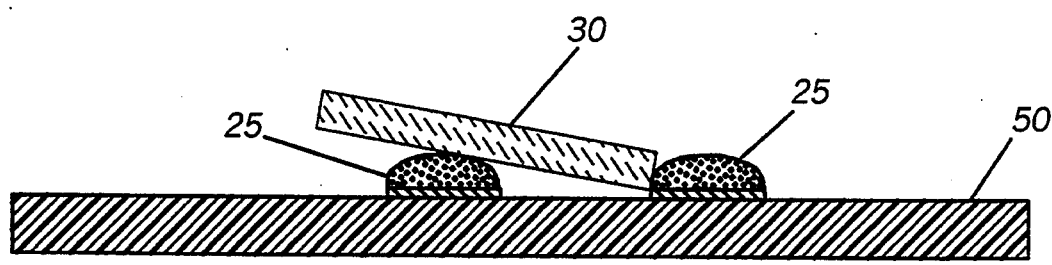
FIG. 3 is a cross-sectional view of a misaligned component on a solder pad and supporting substrate used in the prior art.

The benefits of an electronic circuit assembly made in accordance with the present invention can be better understood by comparing the placed electrical component 30 in FIG. 3 with the placed electrical component 130 of FIG. 7. In FIG. 3, the dome-shape of the reflowed solder 25, in conjunction with the combined tolerances of the placement mechanism and the electrical components 130, may cause a misalignment of the component 130 on the substrate 50. In contrast, as shown in FIG. 7, an electronic circuit assembly 100 made in accordance with the present invention is much more tolerant of accumulated errors occurring during the placement of the components 130. Thus, proper electrical contact between the electrical components 130 and electrical circuitry on the underlying substrate is much more likely with the use of the present invention. This results in much better yields during the manufacturing process and a much more reliable end product. The invention also contemplates other electronic devices incorporating an electronic circuit assembly 100 which uses the new solder pad 110 design.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

We claim:

1. A method for forming a solder deposit on a substrate, comprising the steps of:
   providing a solder pad on the substrate;
   forming a cavity through the solder pad and into the substrate;
   depositing solder paste on said solder pad; and
   reflowing said solder paste on said solder pad.

2. The method of claim 1, wherein said cavity forming step comprises the step of drilling through said solder pad into the substrate.

3. The method of claim 1, further comprising the steps of:
   forming a recess in the substrate before the step of providing a solder pad: and
   locating the solder pad over the cavity formed in the substrate.

4. A method of assembling electrical components on a circuit carrying substrate, comprising the steps of:
   locating a solder pad on the substrate;
   forming a cavity through said solder pad and into the substrate;
   depositing solder paste on said solder pad;
   reflowing said solder paste on said solder pad to form reflowed solder;
   placing electrical components on said reflowed solder; and
   reflowing said reflowed solder on said solder pad.

5. The method of claim 4, further comprising the step of
   depositing flux on said reflowed solder before said electrical components placing step.

* * * * *

UNITED STATES PATENT AND TRADEMARK OFFICE
CERTIFICATE OF CORRECTION

PATENT NO. : 5,369,880
DATED : December 6, 1994
INVENTOR(S) : Ved V. Gundotra, Lonnie L. Bernardoni, and Edward J. Hall

It is certified that error appears in the above-indentified patent and that said Letters Patent is hereby corrected as shown below:

Column 4, line 52, should read

-- locating the solder pad over the recess formed in the substrate --.

Signed and Sealed this

Twentieth Day of June, 1995

Attest:

BRUCE LEHMAN

Attesting Officer   Commissioner of Patents and Trademarks